United States Patent
Lu et al.

(10) Patent No.: US 7,189,479 B2
(45) Date of Patent: Mar. 13, 2007

(54) PHOTOTOOL COATING

(75) Inventors: David D. Lu, Austin, TX (US); Mark J. Pellerite, Woodbury, MN (US); Richard M. Flynn, Mahtomedi, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 290 days.

(21) Appl. No.: 10/645,020

(22) Filed: Aug. 21, 2003

(65) Prior Publication Data

US 2005/0042553 A1 Feb. 24, 2005

(51) Int. Cl.
*G03F 9/00* (2006.01)

(52) U.S. Cl. .......................................................... 430/5

(58) Field of Classification Search ...................... 430/5
See application file for complete search history.

(56) References Cited

U.S. PATENT DOCUMENTS

| | | | |
|---|---|---|---|
| 3,306,855 A | 2/1967 | Borecki | 508/431 |
| 3,492,374 A | 1/1970 | LeBleu et al. | 558/186 |
| 3,810,874 A | 5/1974 | Mitsch et al. | 528/70 |
| 4,514,489 A | 4/1985 | Garcia et al. | 430/327 |
| 4,735,890 A | 4/1988 | Nakane | 430/311 |
| 5,032,279 A | 7/1991 | Lee | 210/640 |
| 5,132,446 A | 7/1992 | Tohzuka et al. | 558/186 |
| 5,256,318 A | 10/1993 | Masutani et al. | 252/7.57 |
| 5,286,567 A | 2/1994 | Kubota et al. | 428/422 |
| 5,356,736 A | 10/1994 | Kita et al. | 429/338 |
| 5,550,277 A | 8/1996 | Paciorek et al. | 558/194 |
| 5,602,225 A | 2/1997 | Montagna et al. | 528/25 |
| 5,851,674 A | 12/1998 | Pellerite et al. | 423/421 |
| 6,177,357 B1 | 1/2001 | Lu | 438/745 |
| 6,184,187 B1 | 2/2001 | Howell et al. | 508/427 |
| 6,277,485 B1 | 8/2001 | Invie et al. | 428/336 |
| 6,300,042 B1 | 10/2001 | Mancini et al. | 430/325 |
| 6,376,065 B1 | 4/2002 | Korba et al. | 428/333 |
| 6,387,787 B1 | 5/2002 | Mancini et al. | 438/586 |
| 6,762,013 B2 * | 7/2004 | Sakizadeh et al. | 430/350 |
| 6,824,882 B2 * | 11/2004 | Boardman et al. | 428/457 |
| 2005/0048288 A1 * | 3/2005 | Flynn et al. | 428/411.1 |

FOREIGN PATENT DOCUMENTS

| | | |
|---|---|---|
| EP | 0 603 697 B1 | 3/1997 |
| JP | 62-42160 | 2/1987 |
| JP | 04073652 | 3/1992 |
| JP | 05313376 | 11/1993 |
| JP | 11-080594 * | 3/1999 |
| JP | 11080594 | 3/1999 |

OTHER PUBLICATIONS

David P. Mancini et al., "Low surface energy polymeric release coating for improved contact print lithography", 21st Annual BACUS Symposium on Photomask Technology, Giang T. Dao, Brian J. Grenon, Editors, Proceedings of SPIE vol. 4562 (2002), pp. 593-599.
International Search Report for PCT/US2004/021017.
John G. Van Alsten, "Self-Assembled Monolayers on Engineering Metals: Structure, Derivatization, and Utility", Langmuir 1999, 15, 7605-7614.
F. Sinapi, L. Forget, J. Delhalle and Z. Mekhalif, "Formation and characterization of thin films of $H(CH_2)_xPO(OH)_2$ on polycrystalline zinc substrates", Surf. Interface Anal. 2002; 34: 148-154.
U.S. Appl. No. 10/161,258, filed May 2002, Boardman, et al.
C. Tonelli, et al., *"Linear perfluoropolyether difunctional oligomers: chemistry, properties and applications"*, Journal of Fluorine Chemistry 95, 1999, pp. 51-70.
C. T. Yim et al., "Dynamics of Octadecylphosphonate Monolayers Self-Assembled on Zirconium Oxide: A Deuterium NMR Study", J. Phys. Chem, B 2002, 106, 1728-1733.
D. L. Flowers, "Lubrication in Photolithography", J. Electrochem. Soc.: Solid-State Science and Technology, vol. 124, Oct. 1977, pp. 1608-1612.
Toshiharu Matsuzawa et al., "Surface Conversion for Antisticking to Reduce Patterning Defects in Photolithography", J. Electrochem. Soc.: Solid-State Science and Technology, vol. 128, No. 1, Jan. 1981, pp. 184-187.

* cited by examiner

*Primary Examiner*—Kathleen Duda
(74) *Attorney, Agent, or Firm*—Melanie G. Gover

(57) ABSTRACT

A phototool having a fluorinated phosph(on)ate coating and methods of using the phototool.

10 Claims, 3 Drawing Sheets ated phosph(on)ate/silane blend during an ink rub test.
PHOTOTOOL COATING

FIELD

The present invention relates in general to contact printing and, more particularly, to a coating composition and a method of coating a phototool used in a photolithographic process.

BACKGROUND

Current product trends in electronics are requiring flexible circuits of finer and finer pitch. A repeating defect caused by small particles that adhere to a phototool during the imaging step of the flexible circuit making process may significantly reduce the product yield.

The fabrication of flexible circuits involves the creation of several layers of dielectric and conductive materials that are in intimate contact with layers adjacent to them. At least one of these layers may be patterned by selectively introducing material into or removing material from that layer. The pattern may be created by photolithographic processes. For example, a layer of photoresist material is applied onto the surface of the layer to be patterned. A phototool having transparent and opaque areas in the form of the desired pattern is used to selectively expose the photoresist to ultraviolet light. The light will either cause portions of the photoresist to undergo a crosslinking reaction in the exposed areas as in the case of a negative photoresist or will undergo reaction to break down the polymer structure in the exposed areas as is the case with a positive photoresist. The desired portion of the photoresist may be removed by an appropriate solvent. The exposed underlying area may be etched away in the case of subtractive processing or added to in the case of additive processing. In either case the layer is patterned.

Photolithographic processes enable the creation of flexible circuits having excellent feature resolution as well as allowing high throughput of the manufacturing process. If different patterns are applied to different layers, the phototool must be correctly aligned on the photoresist layer. The phototool may be secured to the photoresist by clamping or vacuum when the phototool is placed in contact with the photoresist during this photolithographic process.

However, defects in the pattern or the phototool are routinely experienced, especially when the phototool is used repeatedly to print several substrates consecutively without cleaning the phototool. Consequently, phototools must be inspected and cleaned regularly. This greatly affects the throughput of the lithographic process as well as introducing added cost if the defects cannot be eliminated and the phototools must be replaced.

Conventional phototools often comprise chrome and glass regions. The light passes through the glass regions but not the chrome regions. Both glass and chrome are high surface energy materials, which can cause particles of the photoresist or dust to adhere to the phototool. When particles stick to the glass, light is absorbed and as a result does not reach the photoresist. This can result in inadequate exposure of a given area, which in turn creates defects. Furthermore, particles that adhere to the phototool can create a gap between the phototool and the photoresist surface, reducing resolution of the resulting image.

SUMMARY

One embodiment of the present invention provides a method of patterning a device using a phototool having transparent portions and a first and second surface, comprising (a) applying a layer comprising a fluorinated phosph(on)ate material to the first surface of the phototool; (b) placing the coated first surface of the phototool against the device such that the layer of fluorinated phosph(on)ate is in contact with the device; and (c) applying radiation to the second surface of the phototool for affecting a pattern in the device.

Another embodiment of the present invention provides a method of creating patterns in a patternable material comprising (a) applying a layer of a fluorinated phosph(on)ate material to a first surface of a phototool; (b) applying photoresist to a surface of the patternable material; (c) placing the first surface of the phototool in contact with the photoresist; (d) applying radiation to the phototool so a pattern is created in the photoresist; (e) removing a portion of the photoresist to expose a portion of the patternable material surface; and (f) modifying the exposed surface of the patternable material where the photoresist was removed.

Another embodiment of the present invention provides an article comprising a phototool having transparent portions and opaque portions and having a first and second surface with a layer of a fluorinated phosph(on)ate material on the first surface.

An advantage of at least one embodiment of the present invention is to provide a phototool having a durable coating with low surface energy.

Another advantage of at least one embodiment of the present invention is to extend phototool service life by reducing cleaning requirements.

Another advantage of at least one embodiment of the present invention is to improve circuit making yield, especially in fine pitch circuit making.

As Used in this Application:

"fluorinated phosph(on)ate" means any species having a fluorocarbon tail and a phosphate, phosphonic acid, or phosphonate (ester, salt, or acid) headgroup.

"phototool" means any type of mask that is used in conjunction with radiation exposure to pattern a layer of radiation-sensitive material by blocking portions of the layer from the radiation.

DETAILED DESCRIPTION

Figure 1:
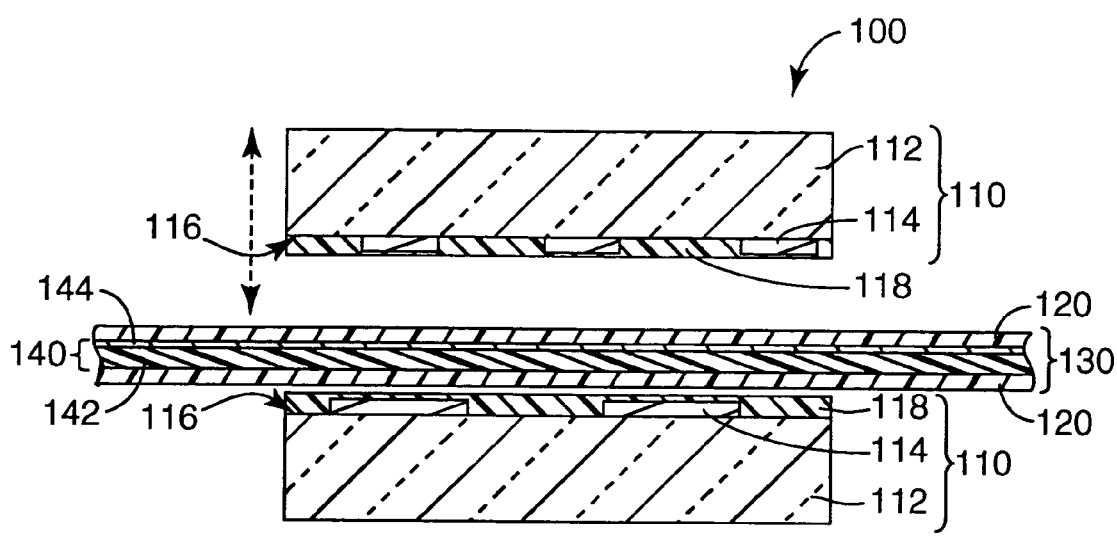
FIG. 1 is a cross sectional view of a simple photolithography apparatus.

An aspect of the present invention is a thin coating comprising a fluorinated phosph(on)ate material applied to a phototool surface to provide very low surface energy. These low energy surfaces can inhibit dirt and other particles from adhering to the phototool surface. This reduces the incidence of imaging defects during photolithographic processes, such as those used to make flexible circuits. The ability to prevent adhesion of particles to the phototool allows for better yields on fine pitch flexible circuits.

The fabrication of flexible circuits involves the creation of several layers of dielectric and conductive materials that are in intimate contact. At least one of these layers may be patterned by selectively introducing material into or removing material from that layer to form circuit traces or features in the dielectric film such as windows, vias, etc. The pattern may be created by photolithographic processes. An image of the desired pattern is created by shining UV light through a phototool having the desired pattern onto a suitable receptor material, e.g., photoresist, which is in contact with the layer to be patterned.

A phototool comprises a UV-transparent base material such as a glass, quartz, or the like with a patterned UV-opaque material such as chrome, chrome oxide, or the like on a surface of the UV-transparent base material.

According to one aspect of the present invention, a layer of low surface energy material comprising one or more fluorinated phosph(on)ates, such as a perfluoropolyether phosphate or a perfluoropolyether phosphonate (ester, salt, or acid), diluted in a suitable solvent is applied to the phototool surface by a conventional coating process, such as spray coating, spin coating, dip coating, or the like. A perfluoropolyether silane may be included in the applied coating. The coating may then be air dried to remove the solvent, followed by baking in the oven, typically at a temperature of about 100° C. to about 150° C. for about 30 minutes, to remove any residual solvent, induce crosslinking of the perfluoropolyether silane, and enhance the bonding of the coating to the phototool surface.

These coated phototools may be used in photolithographic processes, such as those used to pattern metal and dielectric layers of a flexible circuit. In a photolithographic process, the patterned side of the phototool is brought into contact with a UV-receptor material. When UV light is transmitted toward the patterned phototool, the light passes through the transparent regions, but is reflected by the opaque regions, thereby exposing selected portions of the UV-receptor material to the light. After exposure, the phototool is lifted from the surface of the UV-receptor material, preferably without any sticking of the UV-receptor material or other foreign material to the phototool.

The UV-receptor material is typically a photoresist. For example, a layer of photoresist material is applied onto the surface of a flexible circuit layer to be patterned. The UV light that passes through the phototool is absorbed by the photoresist. The light will either cause the exposed portions of the photoresist to undergo a crosslinking reaction, as in the case of a negative photoresist, or will cause a depolymerization reaction to break down the polymer structure in the exposed areas, as is the case with a positive photoresist. The desired portion of the photoresist may then be removed by an appropriate solvent. The flexible circuits may then be processed by conventional methods, such as those described in U.S. Pat. Nos. 5,227,008; 6,177,357; or 6,403,211. For example, the exposed underlying area may be etched away in the case of subtractive processing or dielectric patterning, or material may be added in the case of additive processing.

FIG. 1 is a cross sectional view of a simple photolithography apparatus 100. The photolithography apparatus 100 includes at least one phototool 110, layered circuit substrate 130 which comprises at least one layer of photoresist 120 and base layer 140. Base layer 140 is made of a polymer (typically polyimide) layer 142, and a metal (typically copper) layer 144. Phototool 110 comprises a transparent material 112, typically of glass or quartz, with coated regions of opaque material 114, typically chromium having an oxide surface, interspersed on a surface of transparent material 112 in a manner well known to those skilled in the art. Per the present invention, a layer of low surface energy fluorinated phosph(on)ate material 118 is applied to surface 116 of the transparent material 112 (including opaque material 114).

The fluorinated phosph(on)ate materials typically have molecular weights in the range of 400 to 5000, more preferably 1000 to 3000, and have 3 or more monomer units in the fluorinated segments. Suitable fluorinated phosph(on)ate materials include perfluoropolyether phosphonic acids and fluorinated monophosphate esters, which represent useful classes of self-assembling materials due to their ability to form robust monolayer films on a wide range of metal (oxide) surfaces. Other suitable fluorinated phosph(on)ate materials include partially and fully fluorinated alkanephosphonic acids and perfluorooctyl derivatives. These materials are extremely effective in imparting low surface energy properties to many metal (oxide) surfaces. Other suitable phosphonic acids may be based on partially fluorinated alkyl segments such as those in $CF_3(CF_2)_m(CH_2)_nPO_3H_2$, where m=3–10; and n=4–22 as disclosed in commonly assigned and co-pending U.S. patent application Ser. No. 10/161258 entitled "Fluorinated Phosphonic Acids."

Other suitable fluorinated phosph(on)ates include amide-linked perfluoropolyether phosphonic acids such as those shown in Formulae I and II. An additional class of amide-linked perfluoropolyether monophosphate esters is shown in Formula III.

Formula I

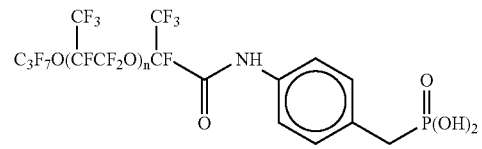

Formula II

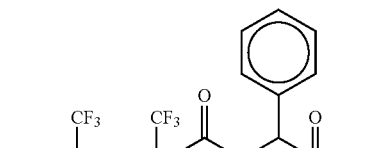

Formula III

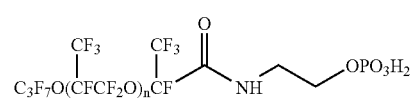

In each of Formulae I to III, the value of n is in the range of 3 to about 30, more preferably 3 to about 15, and most preferably 3 to about 10.

Other suitable fluorinated phosph(on)ates include poly (hexafluoropropyleneoxide-co-difluoromethylene oxide)

alcohol ethoxylated phosphate. For a discussion of perfluoropolyether group structures, as well as other acceptable linking group structures, see U.S. Pat. No. 6,277,485 at column 7, line 29 through column 8 line 7. For a discussion of suitable linking group structure between the perfluoropolyether and the phosph(on)ate, see U.S. Pat. No. 6,277,485 at column 8, lines 7–20. Other suitable linking groups include $C_{6-C20}$ aryl-containing linking groups such as arylene, alkarylene, and aralkylene, either unsubstituted or substituted with heteroatoms or heteroatom-containing functional groups such as —N(R), —O—, —S—, —CO—, —N(R)CO—, —N(R)SO$_2$—, and —CO$_2$—, where R=H or $C_{1-C4}$ alkyl.

In at least one embodiment of the invention, the fluorinated phosph(on)ate forms a self-assembled monolayer on the transparent and opaque surfaces of the phototool. Fluorinated phosph(on)ate monolayers are particularly likely to form on metal oxides such as chromium, aluminum, copper, and nickel oxides. They can also form on glass and quartz, but adhere more readily to metal oxides. Self-assembled monolayers are advantageous because they are generally extremely thin, on the order of 10 nm or less, and consequently do not alter the optical or surface structural properties of the original substrate. In most embodiments the fluorinated phosph(on)ate layer is about 1 nm to about 10 nm thick. In at least one embodiment, the fluorinated phosph (on)ate layer is about 6 nm thick.

Although the fluorinated phosph(on)ate material will adhere to UV-transparent materials, such as glass, in addition to UV-opaque materials, such as chrome oxide, fluorinated silanes typically adhere to glass better than fluorinated phosph(on)ates. Accordingly, the fluorinated phosph(on)ate material may be used alone or with a fluorinated silane.

A suitable fluorinated silane is of the following Formula IV:

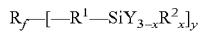

where: $R_f$ is a monovalent or divalent polyfluoropolyether group; the connecting group $R^1$ is a divalent alkylene group, arylene group, or combinations thereof, optionally containing one or more heteroatoms (e.g., oxygen, nitrogen, or sulfur) or functional groups (e.g., carbonyl, amido, or sulfonamido) and optionally substituted with halogen atoms, preferably containing about 2 to about 16 carbon atoms (more preferably, about 3 to about 10 carbon atoms); $R^2$ is a lower alkyl group (i.e., a $(C_{1-C4})$alkyl group, preferably, a methyl group); Y is a halide, a lower alkoxy group (i.e., a $(C_{1-C4})$alkoxy group, preferably, a methoxy or ethoxy group), or a lower acyloxy group (e.g., —OC(O)R$^3$ wherein R$^3$ is a $(C_{1-C4})$alkyl group); x is 0 or 1; and y is 1 (when $R_f$ is monovalent) or 2 (when $R_f$ is divalent). Suitable compounds typically have a number average molecular weight of at least about 400, and preferably, at least about 1000. Preferably, x=0 and Y is a lower alkoxy group.

The polyfluoropolyether group ($R_f$) can include linear, branched, and/or cyclic structures, that may be saturated or unsaturated, and substituted with one or more oxygen atoms. It is preferably a perfluorinated group (i.e., all C—H bonds are replaced by C—F bonds). More preferably, it includes perfluorinated repeating units selected from the group of —(C$_n$F$_{2n}$)—, —(C$_n$F$_{2n}$O)—, —(CF(Z))—, —(CF(Z)O)—, —(CF(Z)C$_n$F$_{2n}$O)—, —(C$_n$F$_{2n}$CF(Z)O)—, —(CF$_2$CF(Z) O)—, and combinations thereof. In these repeating units Z is a perfluoroalkyl group, an oxygen-substituted perfluoroalkyl group, a perfluoroalkoxy group, or an oxygen-substituted perfluoroalkoxy group, all of which can be linear, branched, or cyclic, and preferably have about 1 to about 9 carbon atoms and 0 to about 4 oxygen atoms. The number of repeat units in the polyfluoropolyether group ($R_f$) is sufficient to form a compound having a number average molecular weight of at least about 400, and preferably, sufficient to form a polyfluoropolyether group having a number average molecular weight of at least about 1000. For the monovalent polyfluoropolyether group (wherein y is 1 in Formula IV above), the terminal groups can be $(C_nF_{2n+1})$—, $(C_nF_{2n+1}O)$—, $(X'C_nF_{2n}O)$—, or $(X'C_nF_{2n+1})$— wherein X' is H, Cl, or Br, for example. Preferably, these terminal groups are perfluorinated. In these repeating units or terminal groups, n is 1 or more, and preferably 1 to about 4.

Preferred structures for a divalent perfluoropolyether group include —CF$_2$O(CF$_2$O)$_m$(C$_2$F$_4$O)$_p$CF$_2$—, —CF(CF$_3$) (OCF$_2$CF(CF$_3$))$_p$OC$_n$F$_{2n}$O (CF(CF$_3$)CF$_2$O)$_2$CF(CF$_3$)—, and —(CF$_2$)$_3$O(C$_4$F$_8$O)$_p$(CF$_2$)$_3$—, where an average value for m is 0 to about 50 and an average value for (p+p') is 0 to about 50, with the proviso that both m and p cannot be 0 in the same group and where n=1–6. Of these, particularly preferred structures are —CF$_2$O(CF$_2$O)$_m$(C$_2$F$_4$O)$_p$CF$_2$—, —CF$_2$O(C$_2$F$_4$O)$_p$CF$_2$—, and —CF(CF$_3$)(OCF$_2$CF(CF$_3$))$_p$, OC$_n$F$_{2n}$O (CF(CF$_3$)CF$_2$O)$_p$CF(CF$_3$)—. Particularly preferred structures for a monovalent perfluoropolyether group include C$_3$F$_7$O(CF(CF$_3$)CF$_2$O)$_p$CF(CF$_3$)— and CF$_3$O (C$_2$F$_4$O)$_p$CF$_2$— wherein an average value for (p+p') is 0 to about 50. As synthesized, these compounds typically include a mixture of polymers. The divalent $R^1$ group can include linear, branched, or cyclic structures, that may be saturated or unsaturated. The $R^1$ group can contain one or more heteroatoms (e.g., oxygen, nitrogen, or sulfur) or functional groups (e.g., carbonyl, amido, or sulfonamido). It can also be substituted with halogen atoms, preferably, fluorine atoms, although this is less desirable, as this might lead to instability of the compound. Preferably, the divalent $R^1$ group is a hydrocarbon group, preferably, a linear hydrocarbon group, optionally containing heteroatoms or functional groups, and more preferably, containing at least one functional group. Examples of $R^1$ groups include —C(O) NH$_2$(CH$_2$)$_3$—, —CH$_2$O(CH$_2$)$_3$—, and —(C$_n$H$_{2n}$)—, wherein n is about 2 to about 6. A preferred $R^1$ group is —C(O)NH$_2$(CH$_2$)$_3$—.

Compounds of Formula IV suitable for use in the present invention have a molecular weight (number average) of at least about 400, and preferably, at least about 1000. Typically, they are no greater than about 5000, but this is normally limited by availability, viscosity, and ease of cure, and preferably, no greater than about 3000, depending upon the viscosity and cure time characteristics desired.

Examples of preferred fluorinated silanes include, but are not limited to, the following structures: XCF$_2$O(CF$_2$O)$_m$ (C$_2$F$_4$O)$_p$CF$_2$X, C$_3$F$_7$O(CF(CF$_3$)CF$_2$O)$_2$CF (CF$_3$)X, XCF (CF$_3$)(OCF$_2$CF(CF$_3$))$_p$OC$_n$F$_{2n}$O (CF(CF$_3$)CF$_2$O)$_p$CF(CF$_3$) X, XCF$_2$O(C$_2$F$_4$O $_p$CF$_2$X, and CF$_3$O(C$_2$F$_4$O)$_p$CF$_2$X, X(CF$_2$)$_3$O(C$_4$F$_8$O)$_p$(CF$_2$)$_3$X, where —X is —R$^1$—SiY$_{3-x}$ R$^2_x$ as defined above in Formula IV or a nonsilane-containing terminal group as defined above (($C_nF_{2n+1}$)—, $(X'C_nF_{2n}O)$—, or $(X'C_nF_{2n+1}O)$— wherein X' is H, with the proviso that at least one X group per molecule is a silane. Preferably, in each silane R$^1$ includes nitrogen. More preferably, at least one X group per molecule is C(O)NH(CH$_2$)$_3$ Si(OR)$_3$ (wherein R is methyl, ethyl, or mixtures thereof), and the other X group, if not a silane, is OCF$_3$, or OC$_3$F$_7$. The values of m and p in these structures can vary, as long as the material has a number average molecular weight of at least about 400. Preferably, an average value of m is within a range of about 1 to about 50, and an average value of (p+p')

is within a range of about 4 to about 40. As these are polymeric materials, such compounds exist as mixtures upon synthesis, which are suitable for use. These mixtures may also contain perfluoropolyether chains bearing no functional groups (inert fluids) or more than two terminal groups (branched structures) as a consequence of the methods used in their synthesis. Typically, mixtures of polymeric materials containing less than about 10% by weight of nonfunctionalized polymers (e.g., those without silane groups, for to example) can be used. Furthermore, mixtures of any of the individually listed compounds of Formula IV can be used.

The compounds of Formula IV can be synthesized using standard techniques. For example, commercially available or readily synthesized perfluoropolyether esters can be combined with a functionalized alkoxysilane, such as a 3-aminopropylalkoxysilane, as described in U.S. Pat. No. 3,810,874, column 7, line 41 to column 8, line 49.

Suitable blends of perfluoropolyether silanes and phosphates are disclosed in U.S. Pat. No. 5,602,225 at column 1, line 34 to column 3, line 53. Suitable perfluoropolyether phosphates are also described in EP Pat. No. 603,697.

The fluorinated phosph(on)ate material, or fluorinated phosph(on)ate/fluorinated silane blend may be applied in any one of several conventional ways, such as spin coating, spraying, dipping, or vapor deposition. An advantage of the fluorinated phosph(on)ates is their solubility (or dispersability) in hydrofluoroethers such as HFE 7100, as well as solubility in organic solvents such as isopropanol. This solubility allows uniform films of excess material to be applied by spray or spin coating from a solution. The substrate can then be heated to accelerate monolayer formation, and the excess can be rinsed or wiped away leaving a monolayer film.

The solvent(s) used to apply the coating composition preferably include those that are substantially inert (i.e., substantially nonreactive with the fluorinated phosph(on)ate and fluorinated silane), aprotic, and capable of dispersing or dissolving (preferably, substantially completely dissolving) the fluorinated phosph(on)ate and fluorinated silane. Examples of appropriate solvents include, but are not limited to, fluorinated hydrocarbons, particularly fluorine-substituted alkanes, ethers, particularly alkyl perfluoroalkyl ethers, and hydrochlorofluoro alkanes and ethers. Mixtures of such solvents can be used.

A particularly preferred class of solvents is hydrofluoroethers, including methyl perfluorobutyl ether and ethyl perfluorobutyl ether, which can be represented by the following general Formula V:

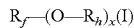

$$R_f\text{—}(O\text{—}R_h)_x \quad (I)$$

where x is an integer of 1 to 3; when x is 1, $R_f$ is selected from the group consisting of linear or branched perfluoroalkyl groups having from 2 to about 15 carbon atoms, perfluorocycloalkyl- containing perfluoroalkyl groups having from 5 to about 15 carbon atoms, and perfluorocycloalkyl groups having from 3 to about 12 carbon atoms; when x is 2, $R_f$ is selected from the group consisting of linear or branched perfluoroalkanediyl groups or perfluoroalkylidene groups having from 2 to about 15 carbon atoms, perfluorocycloalkyl- or perfluorocycloalkylene-containing perfluoroalkanediyl or perfluoroalkylidene groups having from 6 to about 15 carbon atoms, and perfluorocycloalkanediyl groups or perfluorocycloalkylidene groups having from 3 to about 12 carbon atoms; when x is 3, $R_f$ is selected from the group consisting of linear or branched perfluoroalkanetriyl groups having from 2 to about 15 carbon atoms, perfluorocycloalkyl- or perfluorocycloalkylene-containing perfluoroalkanetriyl groups having from 6 to about 15 carbon atoms, and perfluorocycloalkanetriyl groups having from 3 to about 12 carbon atoms; each $R_h$ is independently selected from the group consisting of linear or branched alkyl groups having from 1 to about 8 carbon atoms, cycloalkyl-containing alkyl groups having from 4 to about 8 carbon atoms, and cycloalkyl groups having from 3 to about 8 carbon atoms; wherein either or both of the groups $R_f$ and $R_h$ can contain (optionally contain) one or more catenary heteroatoms; and wherein the sum of the number of carbon atoms in $R_f$ and the number of carbon atoms in $R_h$ is greater than or equal to 4. The perfluorocycloalkyl and perfluorocycloalkylene groups contained within the perfluoroalkyl, perfluoroalkanediyl, perfluoroalkylidene and perfluoroalkanetriyl groups can optionally (and independently) be substituted with, e.g., one or more perfluoroalkyl groups having from 1 to about 4 carbon atoms.

EXAMPLES

Example 1

Perfluoropolyether silane, prepared as described in U. S. Pat. No. 6,277,485, Example 2 and column 13, lines 44–58, and poly(hexafluoropropyleneoxide-co-difluoromethylene oxide) alcohol ethoxylated phosphate("perfluoropolyether phosphate"), available from Aldrich as Catalog #45,767-1, were diluted into a hydrofluoroether solvent available under the trade name NOVEC Engineered Fluid HFE-7100 from 3M Company (St. Paul, Minn.). The concentrations were approximately 0.075 wt % ECC-1000 and 0.025 wt % perfluoropolyether phosphate.

A phototool comprising a glass substrate, pattern-coated with chromium oxide was cleaned by sonication in isopropyl alcohol, then 10 min exposure to air plasma using a Harrick (Ossining, N.Y.) PDC-3×G plasma cleaner/sterilizer. The phototool was then dip coated in the dilute solution. The dip coating withdrawal speed was 3.4 mm/sec using an automated dip coating apparatus. The phototool coating was cured at 120° C. for 30 min. (The dilute solution may, alternatively, be applied using a clean room wipe to wipe the solution onto the phototool. Once the solution has air dried, it can then be cured at 120° C. for 30 min.) After curing, the phototool was allowed to air cool overnight. The excess coating material was then wiped off with a knitted polyester cleanroom wipe available under the tradename SPEC-WIPE to form a uniform thin coating.

The coated phototool was subjected to a number of tests as was an uncoated phototool, for comparison.

Figure 2A:
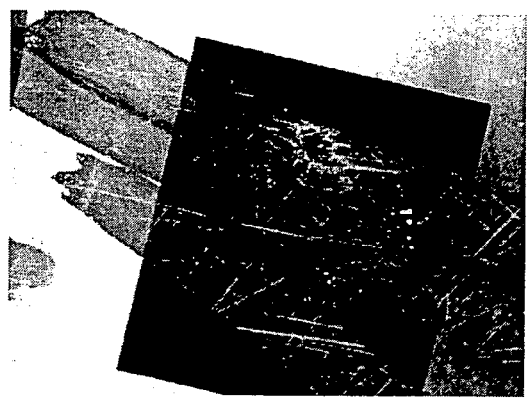
FIGS. 2*a* is a photomicrographic image of an uncoated phototool mask that has been marked with a permanent marker.
Figure 2B:
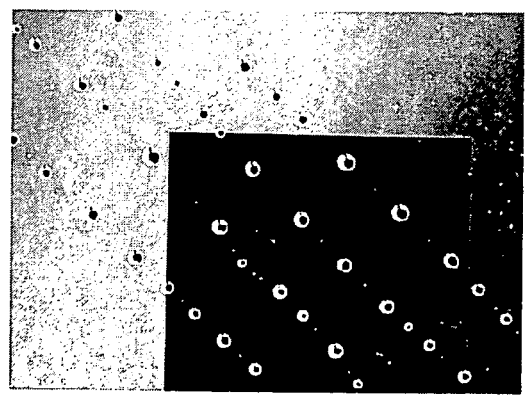
FIGS. 2*b* is a photomicrographic image of a phototool mask coated with a fluorinated phosph(on)ate/silane blend that has been marked with a permanent marker.

The effectiveness of the coating treatment on ink repellency was tested by marking the surface with a permanent marker available under the tradename SHARPIE. FIGS. 2*a* and 2*b* are photomicrographic images of uncoated and coated phototools, respectively, that have been marked. As can be seen, the ink does not bead on the untreated surface (the marks of the permanent marker are still evident), but the ink beads on the coated surface, indicating that the treated surface repels ink as a result of its lower surface energy due to the fluorinated coating.

Figure 3:
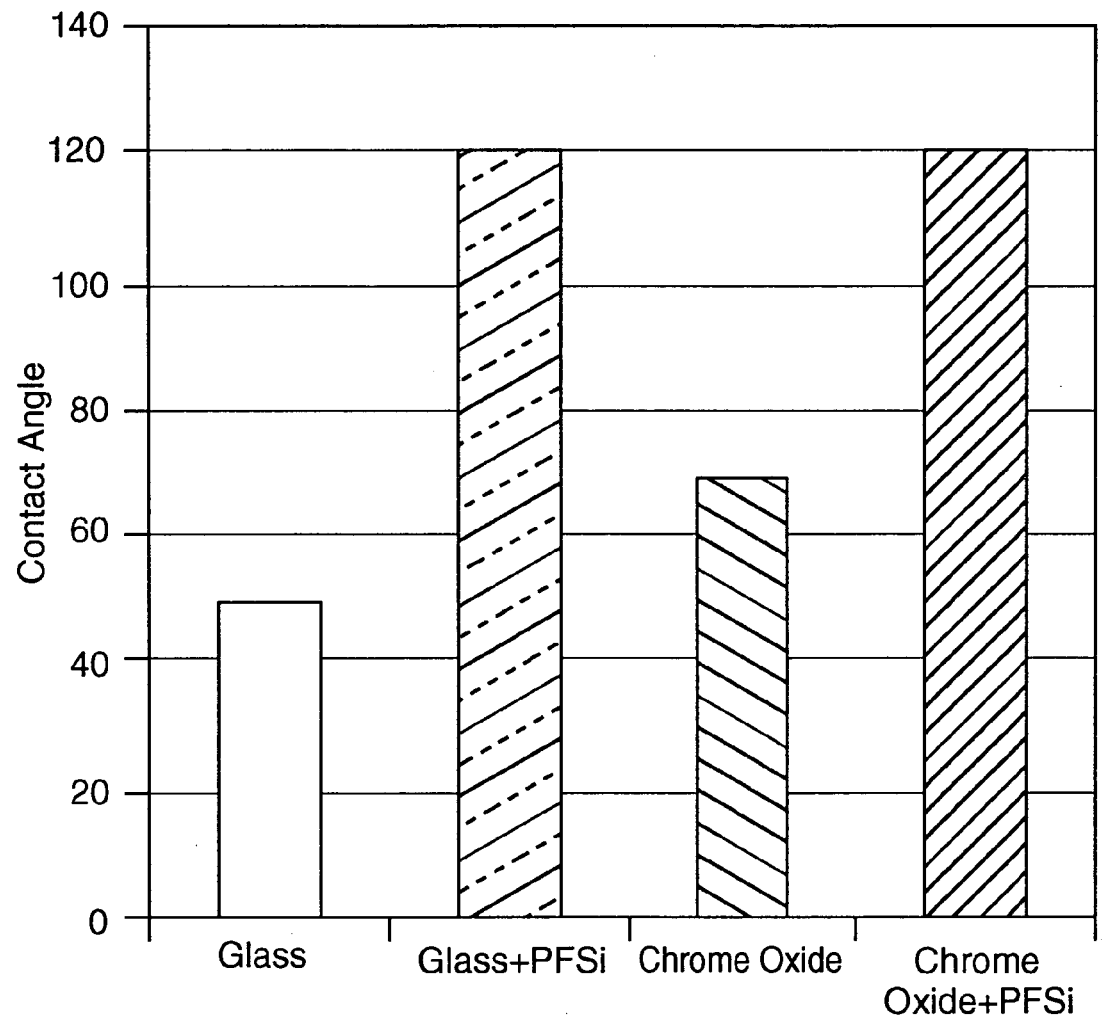
FIG. 3 is a graphical comparison of the contact angle of deionized water on the glass and chrome oxide regions on an uncoated phototool and a phototool coated with a fluorinated phosph(on)ate/silane blend.

The effectiveness of the treatment can also be shown by comparing contact angle measurements as shown in FIG. 3. Static drop contact angles were measured by a standard projection method with de-ionized (DI) water. As the data show, the glass and chrome oxide surfaces treated with perfluoropolyether phosphate and silane had larger contact angles indicating a lower surface energy than their untreated counterparts.

Figure 4:
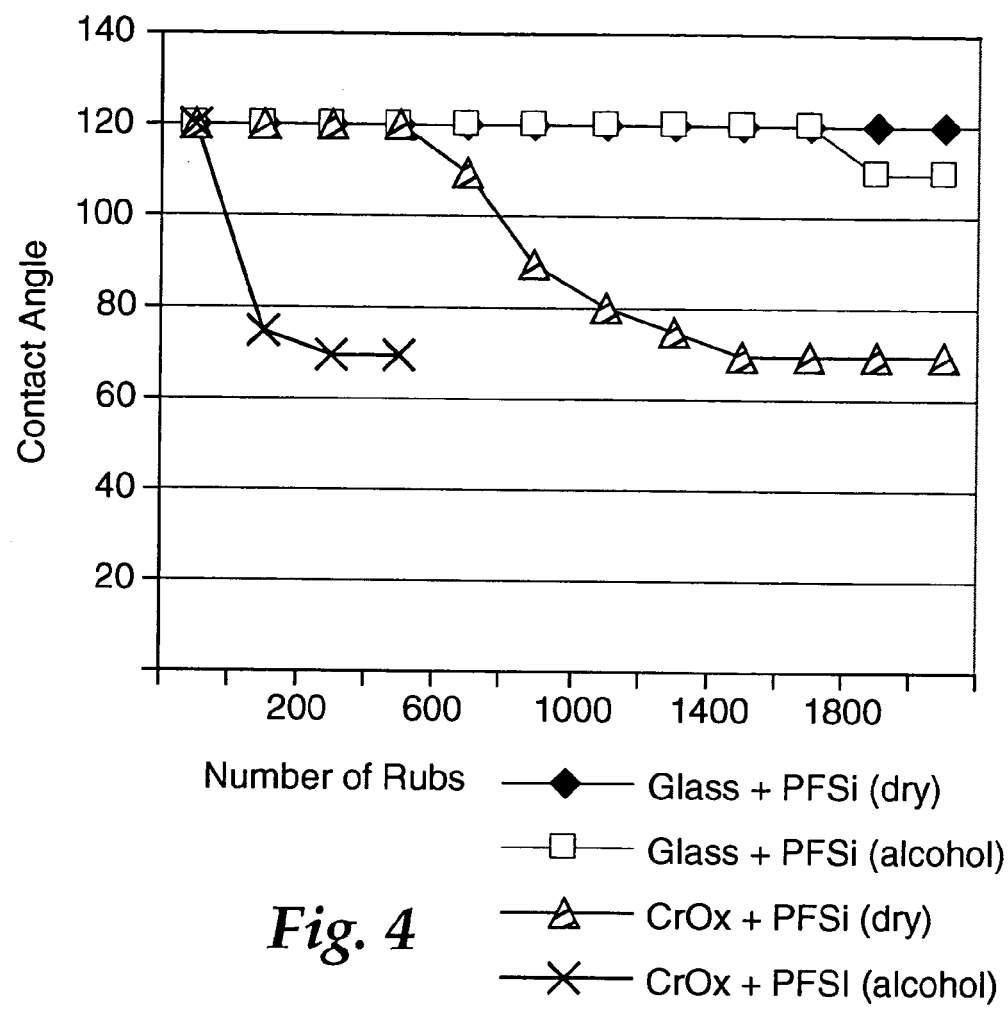
FIG. 4 is a graphical comparison of the contact angle of deionized water on the glass and chrome oxide regions on a phototool coated with a fluorinated phosph(on)ate/silane blend during an ink rub test.
Figure 5:
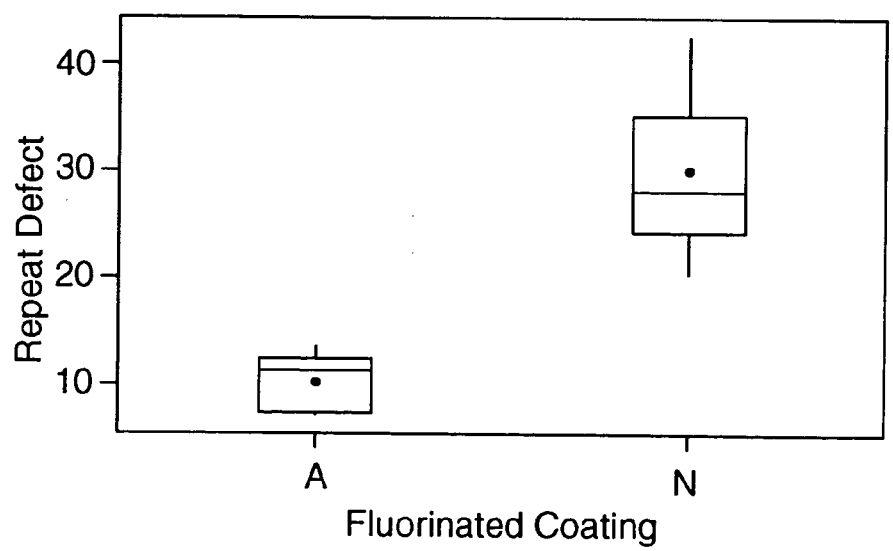
FIG. 5 is a graph illustrating the number of repeat defects occurring during the use of both a coated and an uncoated phototool.

The durability of the coating was tested by conducting an ink rub test with an abrasion-resistance testing apparatus, described in U.S. Pat. No. 2,734,375, obtained from Sutherland Paper Company, Kalamazoo, Mich., with 2 lbs of weight on the glass and chrome oxide portions of the phototool using (1) a dry clean room wipe and (2) a clean room wipe loaded with isopropyl alcohol (solvent) and comparing the contact angle of the treated surface, at various stages of the test, to the contact angle of untreated chromium oxide (about 70) and glass (about 50). As shown by the data in FIG. 4, the perfluoroether phosphate/silane coating increased the durability of the surface in both the dry and alcohol rub tests, especially on the chrome oxide portion of the photomask Flexible circuits were made by conventional means, such as those described in U.S. Pat. No. 5,227,008, using a coated phototool of the present invention to pattern the conductive copper layer. For comparison, flexible circuits were made by the same method with an uncoated phototool. The initial yield improvement for 30-micron pitch circuits was determined by optical inspection for the number of repeating defects between the flexible circuits made with the coated and uncoated phototools. The results are shown in FIG. 5. As can be seen, the coated phototool produced far fewer repeat defects than the uncoated phototool in the greater than 1200 imaging steps made with each phototool. The phototools were cleaned and handled in the same manner and frequency.

Example 2

The procedure disclosed in J. Fluorine Chem. 1999, 95, 51 was followed for the preparation of the phosphate compound of Formula III. Pyrophosphoric acid (25.5 g, 0.14 mole, Aldrich) was placed in a 250 ml round bottom flask equipped with an overhead stirrer, water condenser, and thermocouple. The acid was heated to 60° C. at which point it was a viscous liquid. To this liquid was added in several two ml portions, $C_3F_7O[CF(CF_3)CF_2O]_nCF(CF_3)CONHC_2H_4OH$, ($M_N$=1220, 50 g, 0.041 mole, n=3–10). This addition was slightly exothermic. After the addition was completed, the reaction mixture was held at 60° C. for two hours. Isopropyl acetate (35 ml) was added and the resulting solution then stirred with 150 ml of 2% aqueous HCl for four hours. The lower fluorochemical-containing phase was then separated and dissolved in about 300 ml methyl t-butyl ether (MTBE) and the ether solution then washed twice with an equal volume of 2N HCl solution. The MTBE solution was separated, dried over magnesium sulfate, filtered, and the solvents removed by rotary evaporation. The infrared spectrum of the resulting product showed a strong carbonyl stretch at 1709 cm$^{-1}$. Proton and phosphorus-31 NMR analysis showed that the product was about 75% the desired fluorinated phosph(on)ate and 25% unreacted starting amide alcohol.

A portion of the fluorinated phosph(on)ate product was diluted to 0.25 wt % in HFE-7100 (methyl perfluorobutyl ether) and shaken to obtain a clear solution. Quarter-wafer pieces of aluminum- and chromium-coated silicon wafers (100 mm diameter, obtained from WaferNet, San Jose, Calif.) were cleaned by 5 min. exposure in a home-built UV/ozone chamber, and immediately treated with the above solution. One aluminum piece was immersed in the solution for 1 hour at room temperature, then rinsed for 1 min. in HFE 7100 and allowed to dry in air. One aluminum and one chromium piece were treated by spin coating the solution (500 rpm/5 sec then 2000 rpm/15 sec), then the coated wafer was heated on a vacuum hotplate at 150° C. for 3 min., rinsed in HFE 7100, and allowed to dry in air.

The wafers were subjected to measurement of water and hexadecane contact angles. Measurements were made using as-received reagent-grade hexadecane (Aldrich) and deionized water filtered through a filtration system obtained from Millipore Corporation (Billerica, Mass.), on a video contact angle analyzer available as product number VCA-2500XE from AST Products (Billerica, Mass.). Reported values are the averages of measurements on at least three drops measured on both sides, and are shown in Table 1. Drop volumes were 5 μL for static measurements and 1–3 μL for advancing and receding. For hexadecane, only advancing and receding contact angles are reported because static and advancing values were found to be nearly equal.

TABLE 1

Water and Hexadecane Contact Angles for Coatings of Formula III Composition on Metal-Coated Silicon Wafers

| | | | Contact Angles (°) | | |
|---|---|---|---|---|---|
| Substrate | Application[a] | Liquid | Static | Advancing | Receding |
| Aluminum | 1 hr/RT | Water | 120 | 124 | 115 |
| " | | Hexadecane | — | 76 | 64 |
| | SC/H/R | Water | 117 | 126 | 112 |
| " | | Hexadecane | — | 79 | 61 |
| Chromium | SC/H/R | Water | 135 | 143 | 112 |
| " | | Hexadecane | — | 87 | 50 |

[a]1 hr/RT = 1 hr immersion at room temperature; SC/H/R = spin coat, heat 150° C./3 min, rinse.

The above data show that the Formula III compound rendered the surfaces of both metals highly hydro- and oleophobic.

Example 3

To make the compound of Formula I, diethyl (4-aminobenzyl)phosphonate (10 g, 0.041 mole, Aldrich), triethylamine (4.15 g, 0.041 mole) and methyl t-butyl ether (100 ml) were combined in a 250 ml round bottom flask equipped with an overhead stirrer and water condenser under nitrogen. To this mixture was added, dropwise over about 1.5 hours, $C_3F_7O[CF(CF_3)CF_2O]_nCF(CF_3)COF$, ($M_W$=1017, 41.8 g, 0.041 mole). Near the end of the addition the solution became nearly homogeneous. After stirring for 16 hours at ambient temperature, the solution was diluted with additional MTBE and washed with about 5% aqeuous sodium bicarbonate and then once with 2N HCl. After drying over magnesium sulfate the solvent was removed by rotary evaporation. The amide carbonyl was seen at 1721.5 cm$^{-1}$ in the infrared spectrum of the resulting product.

Without further purification, the phosphonate was dissolved in diethyl ether and bromotrimethylsilane (17.6 g, 0.115 mole, Aldrich) was added all at once. The solution was stirred for 24 hours at ambient temperature and an additional 10 g of the silane added. After several hours, anhydrous methanol was added to decompose the unreacted silane as well as the silyl ester. The solvent was removed from the resulting homogeneous solution and the residue treated two more times with anhydrous methanol in an analogous manner. The final methanol solution after reduction in volume by rotary evaporation was poured into water and the solid phosphonic acid filtered and air-dried. Analysis by proton, phosphorus-31, and carbon-13 NMR confirmed the structure.

Example 4

To make the compound of Formula II, diethyl (α-aminobenzyl)phosphonate hydrochloride (10.5 g, 0.037 mole, Aldrich), triethylamine (7.58 g, 0.075 mole), and MTBE (100 ml) were combined in a 250 ml round bottom flask equipped with a magnetic stirrer and water condenser. $C_3F_7O[CF(CF_3)CF_2O]_nCF(CF_3)COF$, ($M_w$=1017, 35 g, 0.034 mole) was added in one portion and the resulting mixture stirred for 16 hours at ambient temperature. No remaining acid fluoride was observed by infrared analysis at the end of this reaction period. Water was added and the lower fluorochemical-containing phase separated and washed two more times with dilute HCl in order to remove any residual triethylamine salts as well as unreacted phosphonate starting material. The solvent was removed via rotary evaporation and then treated with bromotrimethylsilane (21 g, 0.14 mole). In this case a small amount of diethyl ether was added and the solution refluxed for six hours and then stirred for an additional 18 hours at ambient temperature.

The workup of the composition followed that described above in Example 3. However, it was found that this procedure was insufficient to completely hydrolyze the diethyl phosphonate. The partially hydrolyzed mixture (20.2 g) was then treated with an additional 20 g bromotrimethysilane and heated to reflux (about 80° C.) for eighteen hours. The removal of the silyl ester by the addition of several portions of methanol proceeded as described in Example 3 although the final product was not precipitated from water. The infrared spectrum of the product showed a carbonyl peak at 1712 cm$^{-1}$. The structure was confirmed by proton, fluorine-1 9, and carbon-13 NMR analysis.

Example 5

Samples of Formulae II and III compounds were diluted to 0.1 wt % in HFE 7100 and shaken to obtain clear solutions. Formula I compound could not be readily dissolved directly into HFE 7100, so it was first diluted to 5 wt % in isopropyl alcohol and shaken to dissolve the solid. This solution was filtered through a 0.45 µm filter cartridge to remove a small amount of undissolved material. The resulting clear solution (4.97 wt % solids by gravimetry) was diluted (1 g) with 49 g HFE-7100 to prepare a 0.1 wt % solution, which was clear and storage-stable with respect to formation of precipitate for at least several weeks at room temperature.

Three quarter-wafer pieces each of aluminum- and chromium-coated silicon wafers (100 mm diameter, obtained from WaferNet, San Jose, Calif.) were cleaned by 5 min exposure in a home-built UV/ozone chamber, and immediately treated with the above solutions by spin coating. This was done by applying 2 ml coating solution by pipette to the wafer while it was spinning at 2000 rpm. The wafers were then heated on a vacuum hotplate at 150° C. for 3 min., allowed to cool, then rinsed for 1 min in HFE-7100 and allowed to dry in air. Water contact angles were measured using the procedures and apparatus described in Example 2. Results appear in Table 2.

TABLE 2

Water Contact Angles for Coatings of Formulae I, II, and III Compounds on Metal-Coated Silicon Wafers

| Compound | Substrate | Static CA (°) | Adv CA (°) | Rec CA (°) |
|---|---|---|---|---|
| Formula I | Aluminum | 120 | 123 | 114 |
| | Chromium | 133 | 140 | 110 |
| Formula II | Aluminum | 122 | 125 | 105 |
| | Chromium | 130 | 140 | 113 |
| Formula III | Aluminum | 122 | 126 | 117 |
| | Chromium | 132 | 139 | 111 |

Example 6

Samples of Formulae I and II phosphonic acids were diluted to 0.2 wt % in isopropyl alcohol and shaken to obtain clear solutions. Four quarter-wafer pieces of aluminum-coated silicon wafer (100 mm diameter, obtained from WaferNet, San Jose, Calif.) were cleaned by 5 min exposure in a home-built UV/ozone chamber, and immediately treated with the above solutions. Two pieces were treated with each solution, one by 1 hour immersion at room temperature followed by 1 min. rinse in isopropyl alcohol, the other by spin coating (500 rpm/5 sec. then 2000 rpm/15 sec.) followed by heating 3 min. at 150° C. on a vacuum hotplate, then rinsing 1 min. in isopropyl alcohol. The coated wafer pieces were blown dry under nitrogen, then subjected to measurement of water contact angles using the procedures and apparatus described in Example 2. Results appear in Table 3.

TABLE 3

Water Contact Angles for Coatings of Formula I and II Compounds on Aluminum-Coated Silicon Wafers

| Compound | Application[a] | Static CA (°) | Adv CA (°) | Rec CA (°) |
|---|---|---|---|---|
| Formula I | 1 hr/RT | 115 | 124 | 92 |
| | SC/H/R | 111 | 123 | 92 |
| Formula II | 1 hr/RT | 103 | 112 | 57 |
| | SC/H/R | 99 | 114 | 65 |

[a]1 hr/RT = 1 hr immersion at room temperature; SC/H/R = spin coat, heat 150° C./3 min, rinse.

Comparison of these data with results from Example 2 shows that coatings with higher contact angles were obtained using HFE 7100 as the solvent.

Although the present invention has been described with reference to specific Figures and embodiments, workers skilled in the art will recognize that changes may be made in form and detail without departing from the spirit and scope of the invention.

What is claimed is:

1. An article comprising a phototool having transparent portions and opaque portions and having a first and a second surface with a layer of a fluorinated phosph(on)ate material on the first surface, the fluorinated phosph(on)ate material having a perfluorinated polyfluoropolyether group.

2. The article of claim 1 wherein the first surface of the phototool comprises glass and chrome oxide.

3. The article of claim 1 wherein the fluorinated phosph(on)ate is selected from the group consisting of

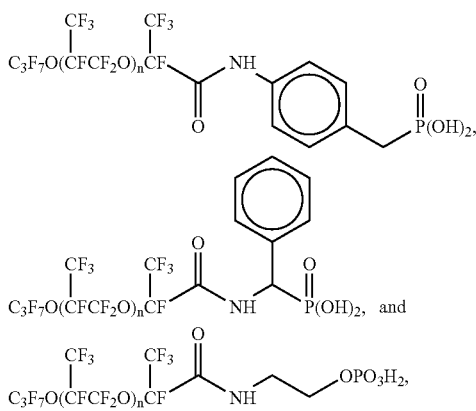

where the value of n ranges from 3 to about 10.

4. The article of claim 1 wherein the thickness of the layer of a fluorinated phosph(on)ate material is less than or equal to about 6 nm.

5. The article of claim 1 wherein the layer of a fluorinated phosph(on)ate layer further comprises a perfluoropolyether silane.

6. The article of claim 1 wherein the fluorinated phosph(on)ate is poly(hexafluoropropyleneoxide-co-difluoromethylene oxide) alcohol ethoxylated phosphate.

7. The article of claim 1 wherein the fluorinated phosph(on)ate comprises a phosphate group.

8. The article of claim 1 wherein the fluorinated phosph(on)ate comprises a phosphonate ester, salt, or acid group.

9. The article of claim 1 wherein the fluorinated phosph(on)ate comprises a monophosphate ester.

10. The article of claim 1 wherein the fluorinated phosph(on)ate comprises a phosphonic acid.

* * * * *

UNITED STATES PATENT AND TRADEMARK OFFICE
CERTIFICATE OF CORRECTION

PATENT NO. : 7,189,479 B2
APPLICATION NO. : 10/645020
DATED : March 13, 2007
INVENTOR(S) : David D. Lu It is certified that error appears in the above-identified patent and that said Letters Patent is hereby corrected as shown below:

Column 4
Line 64, delete "1 5, and insert -- 15,--, therefore

Column 5
Line 8, delete "$C_6\text{-}C_{20}$" and insert -- $C_6\text{-}C_{20}$ --, therefore
Line 13, delete "$C_{1\text{-}C4}$" and insert -- $C_1\text{-}C_4$ --, therefore
Line 47, delete "$C_{1\text{-}C4}$" and insert -- $C_1\text{-}C_4$ --, therefore
Line 49, delete "$C_{1\text{-}C4}$" and insert -- $C_1\text{-}C_4$ --, therefore
Line 51, delete "$C_{1\text{-}C4}$" and insert -- $C_1\text{-}C_4$ --, therefore Column 6
Line 16, delete "$(CF(CF_3)CF_2O)_2$" and insert -- $(CF(CF_3)CF_2O)_p$ --, therefore
Lines 23-24, delete "preferred" and insert -- preferred --, therefore
Line 54, after "$XCF_2O(C_2F_4O$" insert -- ) --, therefore
Line 58, after "H," insert -- Cl, or Br), --, therefore Signed and Sealed this Nineteenth Day of June, 2007

JON W. DUDAS
*Director of the United States Patent and Trademark Office*